United States Patent
Lee

(10) Patent No.: US 11,276,660 B2
(45) Date of Patent: Mar. 15, 2022

(54) SEMICONDUCTOR DEVICE PACKAGE HAVING A CORE SUBSTRATE AND AN EMBEDDED COMPONENT IN THE CORE SUBSTRATE

(71) Applicant: Advanced Semiconductor Engineering, Inc., Kaohsiung (TW)

(72) Inventor: Chih Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 107 days.

(21) Appl. No.: 16/698,671

(22) Filed: Nov. 27, 2019

(65) Prior Publication Data
US 2021/0159200 A1     May 27, 2021

(51) Int. Cl.
| | |
|---|---|
| *H01L 23/00* | (2006.01) |
| *H01L 23/31* | (2006.01) |
| *H01L 21/56* | (2006.01) |
| *H01L 21/48* | (2006.01) |
| *H01L 23/538* | (2006.01) |
| *H01L 23/498* | (2006.01) |

(52) U.S. Cl.
CPC .......... *H01L 24/20* (2013.01); *H01L 21/4857* (2013.01); *H01L 21/56* (2013.01); *H01L 23/3171* (2013.01); *H01L 23/3185* (2013.01); *H01L 23/3192* (2013.01); *H01L 23/49816* (2013.01); *H01L 23/49822* (2013.01); *H01L 23/49838* (2013.01); *H01L 23/5383* (2013.01); *H01L 23/5386* (2013.01); *H01L 23/5389* (2013.01); *H01L 24/19* (2013.01); *H01L 24/24* (2013.01); *H01L 2224/2105* (2013.01); *H01L 2224/24137* (2013.01); *H01L 2224/24146* (2013.01)

(58) Field of Classification Search
CPC ............ H01L 23/3192; H01L 23/5358; H01L 23/5386; H01L 23/49822; H01L 23/49838; H01L 23/3171; H01L 21/4857; H01L 24/20; H01L 24/24; H01L 2224/2105; H01L 2224/24137; H01L 2224/24146
See application file for complete search history.

(56) References Cited

U.S. PATENT DOCUMENTS

| | | |
|---|---|---|
| 9,887,167 B1 | 2/2018 | Lee et al. |
| 2017/0103951 A1* | 4/2017 | Lee ....................... H01L 23/295 |

\* cited by examiner

*Primary Examiner* — Quoc D Hoang
(74) *Attorney, Agent, or Firm* — Foley & Lardner LLP

(57) ABSTRACT

A semiconductor device package includes an electronic component, a first passivation layer having an inner surface surrounding the electronic component, and a conductive layer disposed on the inner surface of the first passivation layer. The electronic component has a first surface, a second surface opposite the first surface, and a lateral surface extended between the first surface and the second surface. The conductive layer has a relatively rough surface. A method of manufacturing a semiconductor device package is also disclosed.

19 Claims, 12 Drawing Sheets

SEMICONDUCTOR DEVICE PACKAGE HAVING A CORE SUBSTRATE AND AN EMBEDDED COMPONENT IN THE CORE SUBSTRATE

BACKGROUND

1. Technical Field

The present disclosure generally relates to a semiconductor device package and a method of manufacturing the same, and to a semiconductor device package having a conductive layer and a method of manufacturing the same.

2. Description of the Related Art

A semiconductor device package may include some semiconductor devices (such as chips or dies) disposed on a carrier. Some devices may be moved or embedded into the carrier to shrink the size of the semiconductor device package.

As technology progress, relatively more components are specified to be embedded into the carrier for miniaturization, which inevitably decreases the distance between the component(s) and sidewall which defines a space (e.g. cavity or room) to receive the component(s). The shrinkage of the above-mentioned distance could be a great challenge when filling dielectric or passivation material into the space. Moreover, heat dissipation issue may become severe if more components are integrated into the carrier.

SUMMARY

In one or more embodiments, a semiconductor device package includes an electronic component, a first passivation layer having an inner surface surrounding the electronic component, and a conductive layer disposed on the inner surface of the first passivation layer. The electronic component has a first surface, a second surface opposite the first surface, and a lateral surface extended between the first surface and the second surface. The conductive layer has a relatively rough surface.

In one or more embodiments, a semiconductor device package includes an electronic component having a first surface, a second surface opposite the first surface, and a lateral surface extended between the first surface and the second surface. The semiconductor device package further includes a first passivation layer having a first surface, a second surface opposite the first surface, and an inner surface surrounding the electronic component. The semiconductor device package further includes a conductive layer disposed on the inner surface of the first passivation layer. The inner surface includes a first portion and a second portion on the first portion. The first portion of the inner surface of the first passivation layer has a first width and the second portion of the inner surface of the first passivation layer has a second width. The second width is greater than the first width.

In one or more embodiments, a method for manufacturing a semiconductor device package includes providing a first passivation layer. The first passivation layer has a first surface and a second surface opposite the first surface. The method further includes forming a recess penetrating through the first passivation layer. An inner surface extended between the first surface and the second surface is defined after the recess is formed. The method further includes disposing a conductive layer on the inner surface of the first passivation layer. The method further includes performing a surface treatment on the conductive layer.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
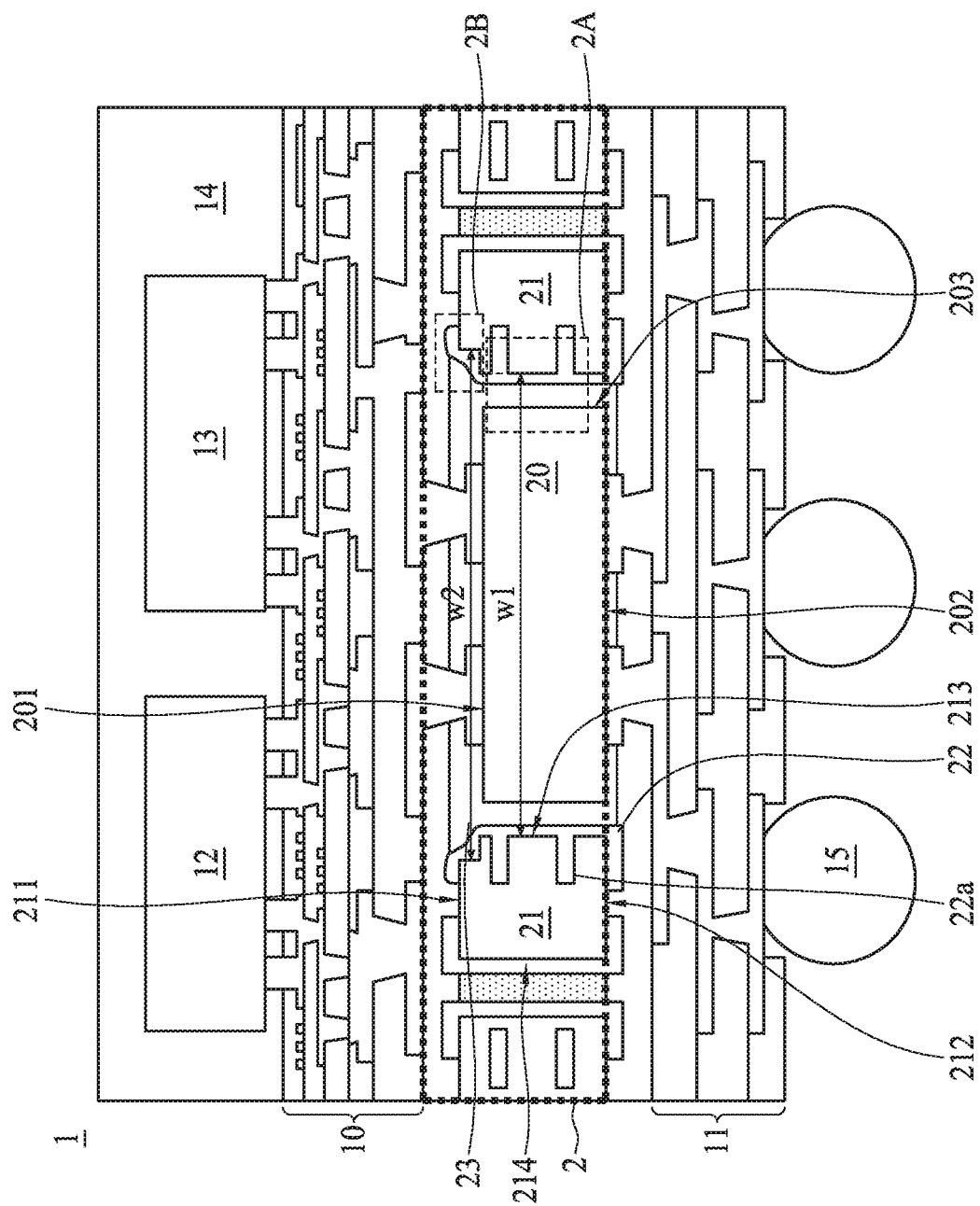
FIG. 1 illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a semiconductor device package 1 in accordance with some embodiments of the present disclosure.

Referring to FIG. 1, the semiconductor device package 1 may include an interconnection structure 10, another interconnection structure 11, an electronic component 12, another electronic component 13, an encapsulation layer 14, an electrical contact 15, an electronic component 20, a carrier 21, a conductive layer 22, and a passivation layer 23.

The carrier 21 may include a surface 211 and a surface 212 opposite the surface 211. The carrier 21 may include a cavity or a space extended between the surface 211 and the surface 212. The carrier 21 may include a surface 213 (or an inner surface) and a surface 214 (or an outer surface) opposite the surface 213. The surface 213 may be referred to as a sidewall or a lateral surface of said cavity or space.

In some embodiments, the carrier 21 may include an interconnection structure, such as a conductive trace (such as a portion 22a) or a through via. The carrier 21 may include a core layer or a core substrate. In some embodiments, the core substrate of the carrier 21 may include, for example but not limited thereto, a molding compound, bismaleimide triazine (BT), a polyimide (PI), a polybenzoxazole (PBO), a solder resist, an Ajinomoto build-up film (ABF), a polypropylene (PP), an epoxy-based material, or a combination of two or more thereof.

The electronic component 20 may be disposed in the space defined by the surface 213 of the carrier 21. The electronic component 20 may be received in the space defined by the surface 213 of the carrier 21. The electronic component 20 may be surrounded by the surface 213 of the carrier 21.

The electronic component 20 may include a surface 201, a surface 202 opposite the surface 201, and a surface 203 (or a lateral surface) extended between the surface 201 and the surface 202. The surface 203 may face the surface 213 of the carrier 21.

As more components (such as a plurality of electronic components 20) are specified to be received in a cavity or space defined in a carrier (such as the carrier 21) for miniaturization, the distance between the components and a lateral surface of the space (such as the distance between the surface 213 of the carrier 21 and surface 203 of the electronic component 20) may be inevitably decreased, rendering processing difficulties in subsequent filling operation (such as the operation illustrated in FIG. 5F) of dielectric material (such as the dielectric material of the passivation layer 23) in the space. Moreover, heat dissipation issue may become severe if more components are integrated into the carrier.

By providing the conductive layer 22 on the surface 213 of the carrier 21, and performing a surface treatment to the conductive layer 22 to adjust the surface roughness of the conductive layer 22, the fluidity of dielectric material of the passivation layer 23 to be filled in the space can be facilitated and a good adhesive force between the conductive layer 22 and the passivation layer 23 can be obtained. In addition, the conductive layer 22 can help to facilitate heat dissipation in the semiconductor device package 1.

As shown in FIG. 1, the electronic component 20 may be surrounded by the passivation layer 23, the conductive layer 22, and the carrier 21. The passivation layer 23 may surround the electronic component 20 and be surrounded by the conductive layer 22. The conductive layer 22 may surround the passivation layer 23 and be surrounded by the carrier 21.

The conductive layer 22 may be disposed on the inner surface 213 of the carrier 21. The conductive layer 22 may be in direct contact with the inner surface 213 of the carrier 21.

The conductive layer 22 may be connected to the portion 22a of the carrier 21. In some embodiments, the portion 22a may have the same material as the conductive layer 22. In some embodiments, the portion 22a may be an extension of the conductive layer 22. For example, the portion 22a may extend toward the outer surface 214. The extending portion (such as the portion 22a) of the conductive layer 22 may help to enhance the adhesive force of the conductive layer 22. The extending portion (such as the portion 22a) of the conductive layer 22 may help to prevent the delamination of the conductive layer 22.

In some embodiments, the conductive layer 22 may include, for example but not limited thereto, aluminum (Al), copper (Cu), chromium (Cr), tin (Sn), gold (Au), silver (Ag), nickel (Ni) or stainless steel, or a mixture, an alloy, or other combination thereof. In some embodiments, the portion 22a may have a material different from the conductive layer 22.

The passivation layer 23 may be disposed between the conductive layer 22 and the electronic component 20. The passivation layer 23 may be in direct contact with the electronic component 20. The passivation layer 23 may be in direct contact with the conductive layer 22.

In some embodiments, the passivation layer 23 may include, for example but not limited thereto, a dielectric material such as pre-impregnated composite fibers (e.g., pre-preg), an ABF, resin, an epoxy-based material, or a combination of two or more thereof.

Figure 5A:
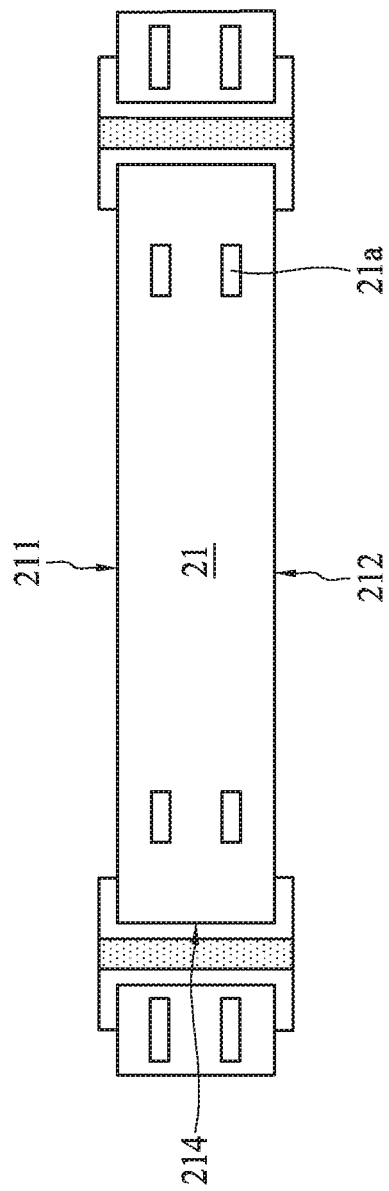
FIG. 5A illustrates one or more stages of a method of manufacturing a semiconductor device package in accordance with some embodiments of the present disclosure.
Figure 5B:
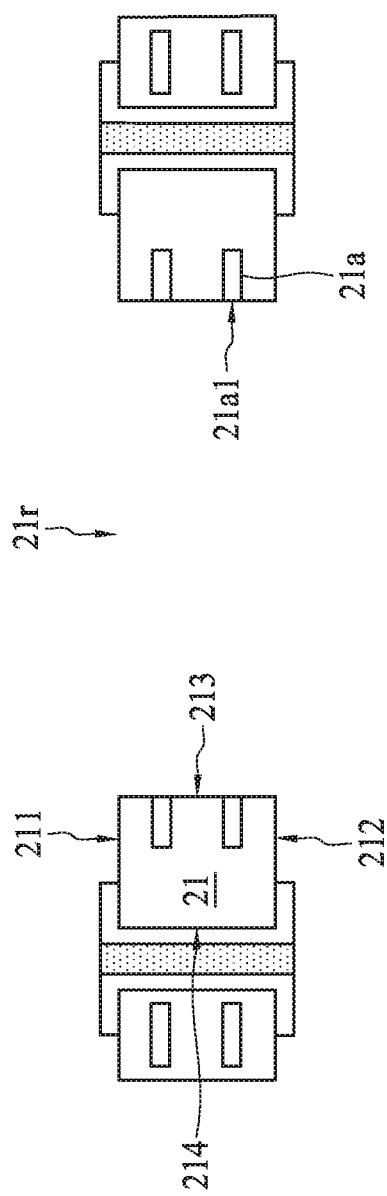
FIG. 5B illustrates one or more stages of a method of manufacturing a semiconductor device package in accordance with some embodiments of the present disclosure.
Figure 5C:
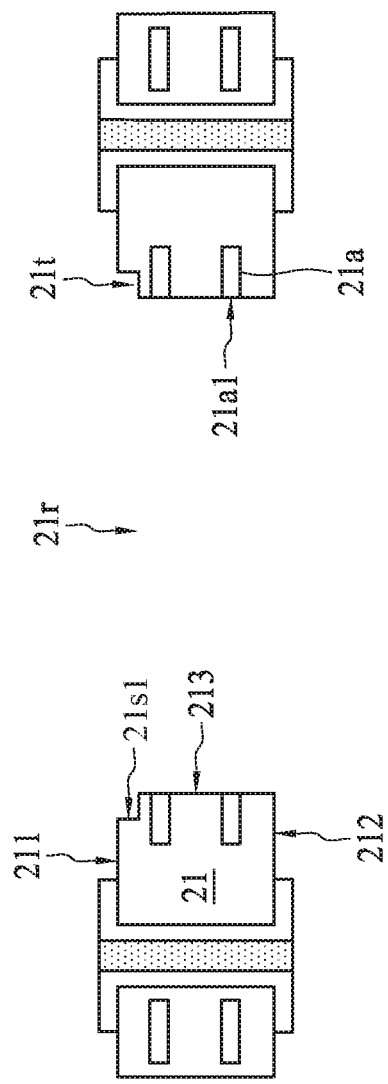
FIG. 5C illustrates one or more stages of a method of manufacturing a semiconductor device package in accordance with some embodiments of the present disclosure.
Figure 5D:
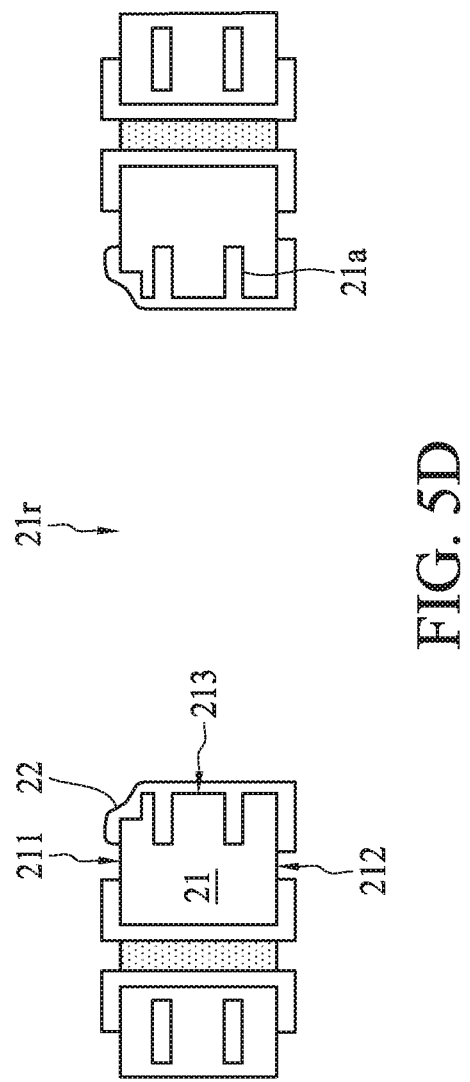
FIG. 5D illustrates one or more stages of a method of manufacturing a semiconductor device package in accordance with some embodiments of the present disclosure.
Figure 5E:
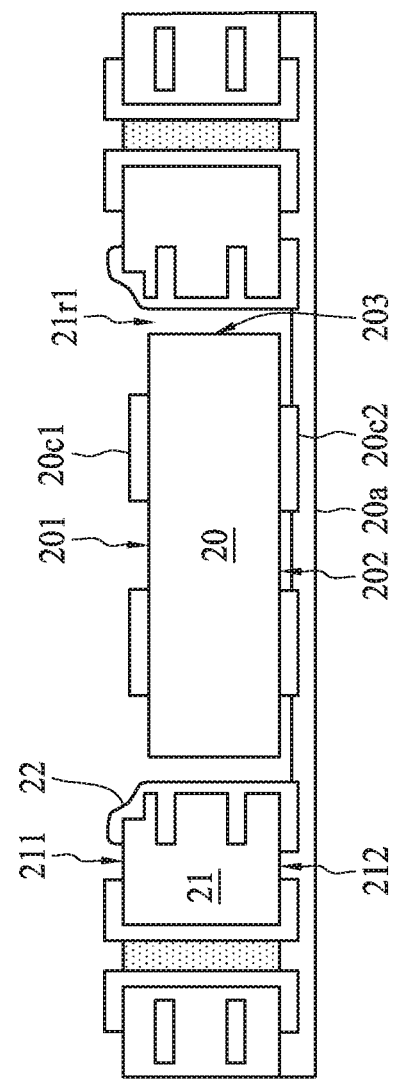
FIG. 5E illustrates one or more stages of a method of manufacturing a semiconductor device package in accordance with some embodiments of the present disclosure.
Figure 5F:
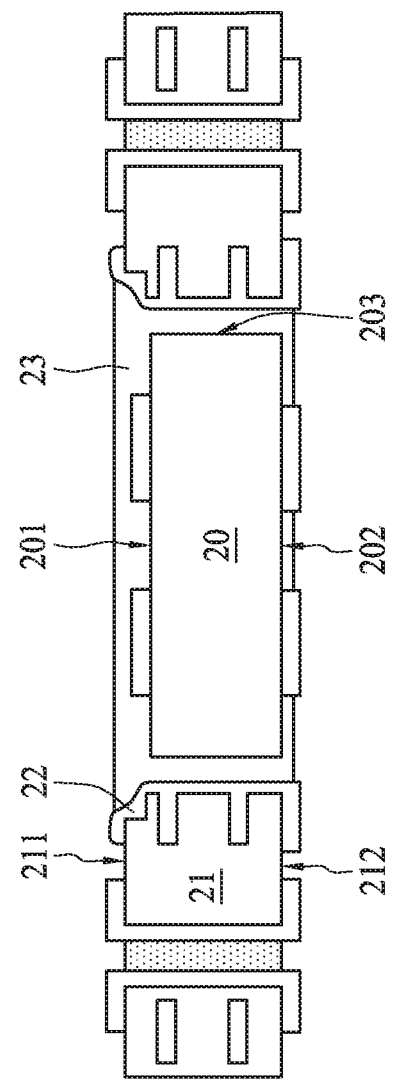
FIG. 5F illustrates one or more stages of a method of manufacturing a semiconductor device package in accordance with some embodiments of the present disclosure.

The passivation layer 23 may include a flowable dielectric material that can be filled into the space of the carrier 21 (as the filling operation illustrated in FIG. 5F).

In some embodiments, the space may be provided with a wider opening to facilitate the fluidity of the dielectric material of the passivation layer 23. In some embodiments, a wider opening can help to fill the dielectric material in the space without introducing voids in the space.

For example, the surface 213 of the carrier 21 may include a portion (which can also be referred to as a first portion of the surface 213) with a first width "w1" and another portion (which can also be referred to as a second portion of the surface 213) with a second width "w2". The second portion may be immediately adjacent to the surface 211 of the carrier 21. The second portion may be defined by a sidewall 21s1 (as denoted in FIG. 2B) of the carrier 21 that connected with the surface 211.

The first width w1 may be different from the second width w2. For example, as illustrated in FIG. 1, the first width w1 is smaller than the second width w2. The second width w2 is greater than the first width w1.

In some embodiments, an elevation of the surface 201 of the electronic component 20 may be different from an elevation of the surface 211 of the carrier 21. For example, as illustrated in FIG. 1, the surface 201 of the electronic component 20 is lower than the surface 211 of the carrier 21. The surface 211 of the carrier 21 is higher than the surface 201 of the electronic component 20.

The interconnection structures 10 and 11 may be disposed on surfaces (e.g., a top surface and a bottom surface) of the carrier 21. The interconnection structures 10 and 11 may include redistribution layers (RDL), and may include conductive units (such as pads, wires, and/or vias) and a dielectric layer. A portion of the conductive units is covered or encapsulated by the dielectric layer while another portion of the conductive units is exposed from the dielectric layer to provide electrical connections for the carrier 21 (and the electronic component 20 embedded in the carrier 21), the electronic components 12 and 13, and the electrical contact 15.

The electronic components 12 and 13 may be disposed on a surface of the interconnection structure 10 facing away from the carrier 21.

The encapsulation layer 14 may be disposed on the interconnection structure 10 to cover or encapsulate the electronic components 12 and 13. In some embodiments, the encapsulation layer 14 may include, for example but is not limited to, an epoxy resin having fillers, a molding compound (e.g., an epoxy molding compound or other molding compounds), a polyimide, a phenolic compound or material, a material with a silicone dispersed therein, or a combination thereof.

The electrical contact 15 (e.g. a solder ball) may be disposed on a surface of the interconnection structure 11 facing away from the carrier 21 and can provide electrical connections between the semiconductor package device 1 and external components (e.g. external circuits or circuit boards). In some embodiments, the electrical contact 15 may include a controlled collapse chip connection (C4) bump, a ball grid array (BGA) or a land grid array (LGA).

Each of the electronic components 12, 13, and 20 may include a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof.

In some embodiments, there may be any number of electronic components in the semiconductor device package 1 depending on product specifications. For example, there may be any number of electronic components embedded in the carrier 21. For example, there may be any number of electronic components disposed on the interconnection structure 10.

Figure 2:
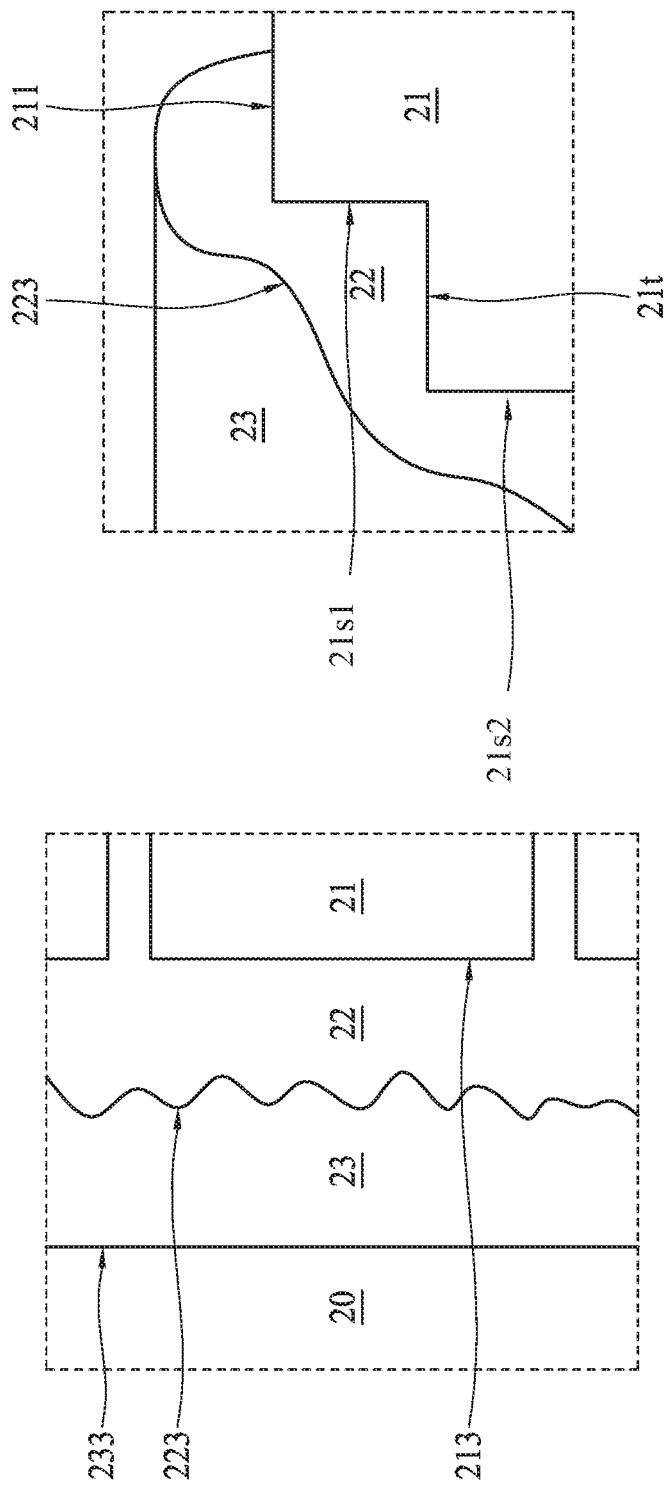
FIG. 2A illustrates an enlarged view of a portion of a semiconductor device package in accordance with some embodiments of the present disclosure.
FIG. 2B illustrates an enlarged view of a portion of a semiconductor device package in accordance with some embodiments of the present disclosure.

FIG. 2A illustrates an enlarged view of a portion of a semiconductor device package in accordance with some embodiments of the present disclosure. For example, the portion in the dotted box 2A in FIG. 1 may be the portion illustrated in FIG. 2A.

As shown in FIG. 2A, the conductive layer 22 may include a surface in contact with the surface 213 of the carrier 21 and an opposite surface 223 in contact with the passivation layer 23. The surface 223 of the conductive layer 22 may be a relatively rough (or relatively uneven) surface.

For example, a roughness of a portion of the surface 223 that in direct contact in the passivation layer 23 may be greater than a roughness of the other portions of the surface 223. For example, a roughness of the surface 223 of the conductive layer 22 may be greater than a roughness of the surface of the conductive layer 22 that opposite the surface 223.

In some embodiments, a roughness of the surface 223 of the conductive layer 22 may be smaller than a roughness of the surface 213 of the carrier 21.

In some embodiments, the surface 223 of the conductive layer 22 has an arithmetical mean roughness (Ra) ranging from about 0.3 micrometer (μm) to about 1.0 μm. In some embodiments, the surface 223 of the conductive layer 22 has a ten-point mean roughness (Rz) ranging from about 3.0 μm to about 10.0 μm.

In some embodiments, a roughness of the surface 223 of the conductive layer 22 may be designed to be lower than or equal to a numerical value to facilitate the fluidity of dielectric material of the passivation layer 23. In some embodiments, a roughness of the surface 223 of the conductive layer 22 may be designed to be higher than or equal to a numerical value to avoid the passivation layer 23 from delaminated from the conductive layer 22.

In some embodiments, the passivation layer 23 may have a surface 233 in contact with the electronic component 20 and an opposite surface in contact with the conductive layer 22. The surface of the passivation layer 23 that in contact with the conductive layer 22 may be a relatively rough or relatively uneven surface.

The passivation layer 23 may be engaged with the conductive layer 22. For example, the surface of the passivation layer 23 that in contact with the conductive layer 22 may be engaged with the relatively rough surface 223 of the conductive layer 22, which enhances the adhesive force between the conductive layer 22 and the passivation layer 23.

FIG. 2B illustrates an enlarged view of a portion of the semiconductor device package in accordance with some embodiments of the present disclosure. For example, the portion in the dotted box 2B in FIG. 1 may be the portion illustrated in FIG. 2A.

As shown in FIG. 2B, the surface 213 of the carrier 21 includes the sidewall 21s1, a top surface 21t, and a sidewall 21s2. The sidewall 21s1 may be substantially perpendicular with the surface 211. The top surface 21t may be substantially coplanar with the surface 211. The surface 211 may connected with the top surface 21t through the sidewall 21s1. The surface 211, the sidewall 21s1, and the top surface 21t may define a step (or a stepped feature or a stepped structure) on the surface 213 of the carrier 21.

The conductive layer 22 covers or encapsulates a part of the surface 211 of the carrier. The conductive layer 22 covers or encapsulates the step on the surface 213 of the carrier 21. The conductive layer 22 covers or encapsulates the sidewall 21s1 and the top surface 21t of the carrier 21.

The conductive layer 22 is in direct contact with a part of the surface 211 of the carrier. The conductive layer 22 is in direct contact with the step on the surface 213 of the carrier 21. The conductive layer 22 is in direct contact with the sidewall 21s1 and the top surface 21t of the carrier 21.

The surface 223 of the conductive layer 22 that over the step may be a slanted or curved surface. For example, the conductive layer 22 fills in the angle defined by the surface 21s1 and the surface 21t. For example, the conductive layer 22 covers the angle defined by the surface 21s1 and the surface 21t.

In some embodiments, the slanted or curved surface of the conductive layer 22 that over the step can help to guide the dielectric material of the passivation layer 23 into the space of the carrier 21.

Figure 3:
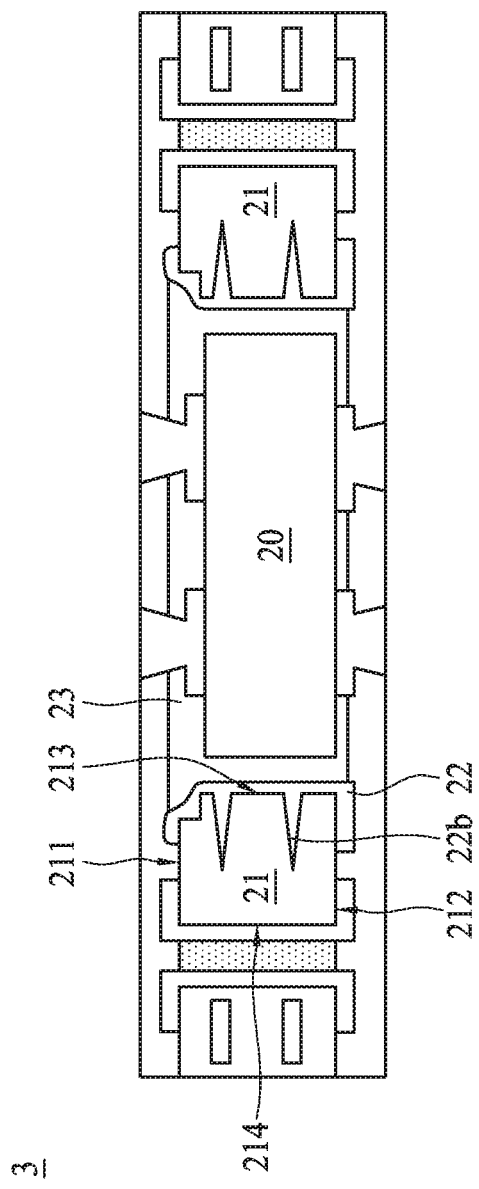
FIG. 3 illustrates an enlarged cross-sectional view of a portion of a semiconductor device package in accordance with some embodiments of the present disclosure.

FIG. 3 illustrates an enlarged cross-sectional view of a structure 3 of a semiconductor device package in accordance with some embodiments of the present disclosure. In some embodiments, the structure in the dotted box 2 in FIG. 1 may be replaced with the structure 3 in FIG. 3.

The structure 3 in FIG. 3 is similar to the structure in the dotted box 2 in FIG. 1, and the differences therebetween are described below.

The conductive layer 22 may be connected with a tapered portion 22b in the carrier 21. In some embodiments, the tapered portion 22b may be a part of the conductive layer 22 that extending into the carrier 21. For example, the portion 22b of the conductive layer 22 may be tapered from the surface 213 of the carrier 21 toward the surface 214 of the carrier 21. In some embodiments, the tapered structure can help to enhance the adhesive force between the carrier 21 and the conductive layer 22.

Although the figures illustrate specific shapes, the disclosure is not limited thereto. The extending portion of the conductive layer that extending into the carrier 21 may be of any shape.

Figure 4:
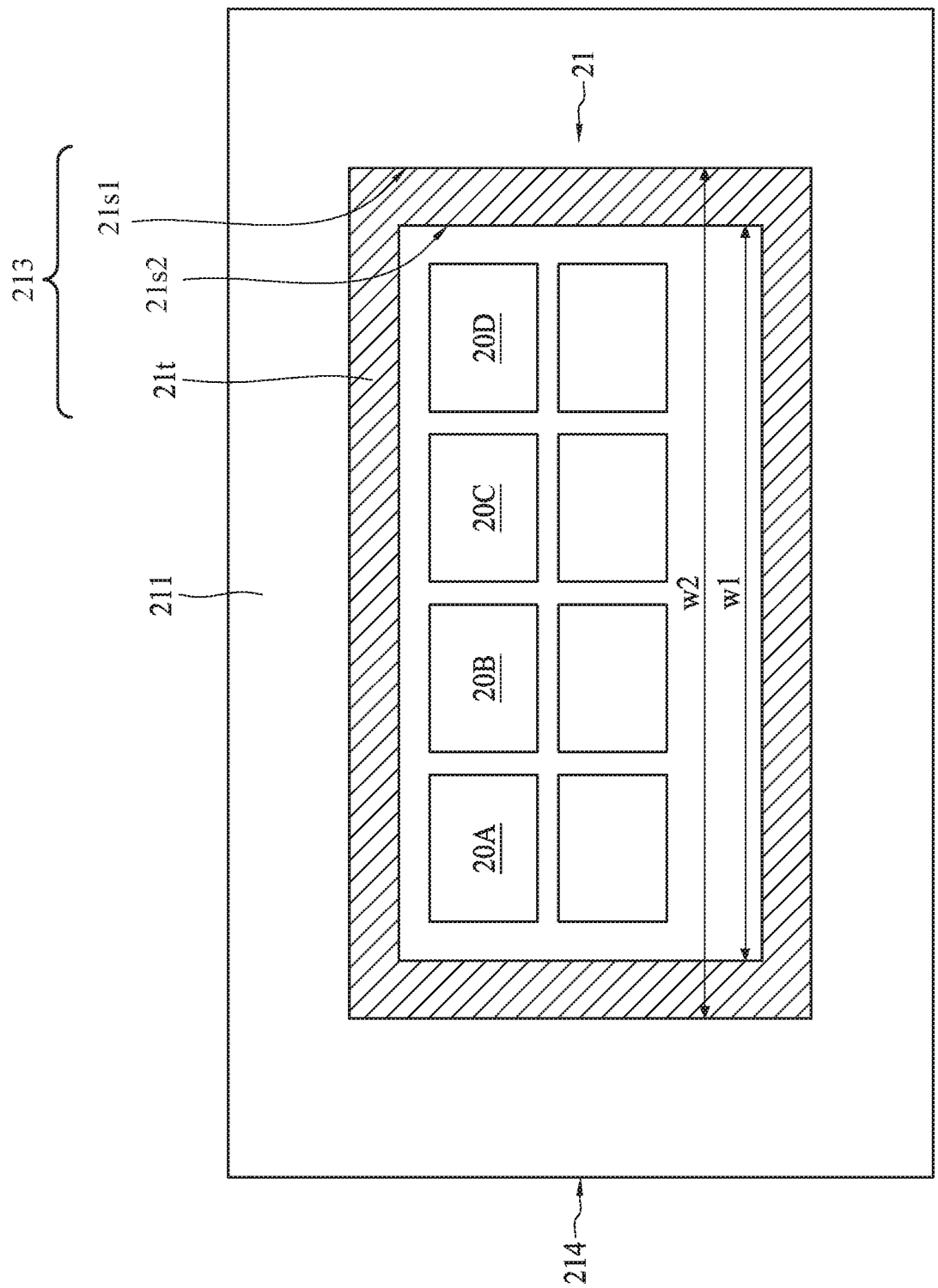
FIG. 4 illustrates a top view of a semiconductor device package in accordance with some embodiments of the present disclosure.

FIG. 4 illustrates a top view of a semiconductor device package in accordance with some embodiments of the present disclosure. In some embodiments, a top view of the semiconductor device package 1 in FIG. 1 may be similar to the top view in FIG. 4.

For clarity and conciseness, the conductive layer 22 and the passivation layer 23 as shown in FIG. 1 are omitted in FIG. 4 for conciseness.

As shown in FIG. 4, the carrier 21 includes the outer surface 214, the surface 211, and the inner surface 213 (including the sidewall 21s1, the sidewall 21s2, and the top surface 21t). The sidewall 21s1 may be substantially perpendicular with the surface 211. The sidewall 21s2 may be substantially perpendicular with the surface 211. The top surface 21t may be substantially coplanar with the surface 211. The surface 211 may connected with the top surface 21t through the sidewall 21s.

The space defined by the sidewall 21s1 has the width w2. The space defined by the sidewall 21s2 has the width w1. The width w2 may be immediately adjacent to the surface 211. In some embodiments, the space defined by the sidewall 21s1 can have any suitable shape, and the present disclosure is not limited to the specific embodiments illustrated in the figures.

In FIG. 4, there is more than one electronic component (such as the electronic components 20A, 20B, 20C, and 20D) received in the space in the carrier 21. As mentioned, with a conductive layer having surface roughness provided on the surface 213 of the carrier 21, the fluidity of the dielectric material into the space can be facilitated. Therefore, the capacity of the electronic components in the semiconductor device package can be increased.

FIG. 5A, FIG. 5B, FIG. 5C, FIG. 5D, FIG. 5E, FIG. 5F, FIG. 5G, and FIG. 5H are cross-sectional views of a wiring structure at various stages of fabrication, in accordance with some embodiments of the present disclosure. At least some of these figures have been simplified for a better understanding of the aspects of the present disclosure.

Referring to FIG. 5A, a carrier 21 may be provided. The carrier 21 may include a surface 211, a surface 212 opposite the surface 211, and a surface 214 extended between the surface 211 and surface 212. The carrier 21 may include an interconnection structure, such as a conductive trace 21a or a through via.

Referring to FIG. 5B, a space or a recess 21r may be formed in the carrier 21. The recess 21r may penetrate through the carrier 21. The recess 21r may have a surface 213 extended between the surface 211 and surface 212.

A surface 21a1 of the conductive trace 21a in the carrier 21 may be exposed after the recess 21r is formed.

Referring to FIG. 5C, a step is formed on the surface 213. In some embodiments, the step may be formed by a router machine, a laser, or other cutting or shaping means. The step may facilitate the fluidity of dielectric material in the subsequent operation.

A sidewall 21s1 and a top surface 21t may be formed after the cutting or shaping operation.

Referring to FIG. 5D, a conductive layer 22 may be provided on the surface 213. The step may be covered by the conductive layer 22.

The conductive layer 22 and the conductive trace 21a in the carrier 21 may join to enhance the adhesive force of the conductive layer 22.

A surface treatment may be performed on the conductive layer 22 to adjust the surface roughness of the conductive layer 22. In some embodiments, the surface treatment may be performed by, for example, an etchant, or through other suitable surface treatment.

After the surface treatment, the conductive layer 22 may include a relatively rough surface surrounding the recess 21r. The relatively rough surface can maintain a good adhesive force between the conductive layer 22 and the dielectric material formed in the subsequent operation.

Referring to FIG. 5E, the structure obtained from the operation in FIG. 5D may be disposed on a temporary carrier or an adhesive layer 20a. An electronic component 20 may be provided on the adhesive layer 20a.

The electronic component 20 may be received in the recess 21r as shown in FIG. 5D. The electronic component 20 may be surrounded by the conductive layer 22 on the surface 213 of the carrier 21. After the electronic component 20 is received in the recess 21r, a remaining space 21r1 may be defined between the electronic component 20 and the conductive layer 22.

The electronic component 20 may include a surface 201, a surface 202 opposite the surface 201, and a surface 203 (or a lateral surface) extended between the surface 201 and the surface 202. The electronic component 20 may include a conductive pad 20c1 on the surface 201 and a conductive pad 20c2 on the surface 202.

Referring to FIG. 5F, a dielectric material may be filled in the remaining space 21r1 as shown in FIG. 5E, forming a passivation layer 23. In some embodiments, the filling operation may be conducted by, for example, an inkjet printing process. An elevation of the surface 201 of the electronic component 20 may be lower than an elevation of the surface 211 of the carrier 21 to facilitate filling the dielectric material. After the dielectric material filled in the remaining space 21r1, the adhesive layer 20a as shown in FIG. 5E may be removed.

Figure 5G:
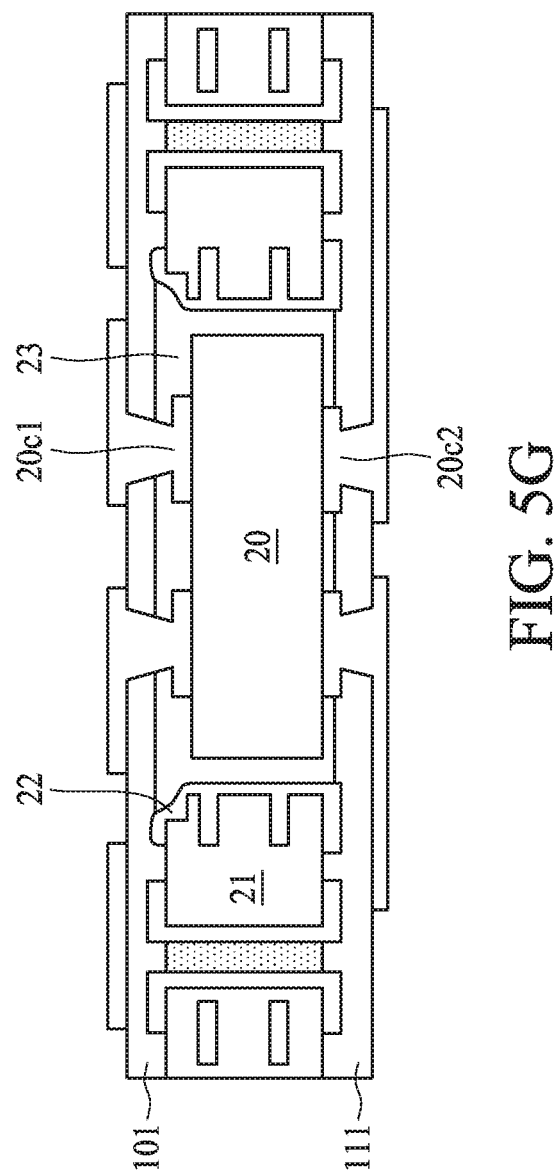
FIG. 5G illustrates one or more stages of a method of manufacturing a semiconductor device package in accordance with some embodiments of the present disclosure.

Referring to FIG. 5G, a dielectric layer 101 may be provided on the carrier 21 and the passivation layer 23. In some embodiments, the dielectric layer 101 may be formed by, for example, coating, lamination or other suitable processes. Then, a photoresist film (or a mask) may be formed on the dielectric layer 101, and the dielectric layer 101 may be patterned through the mask to form a cavity and expose a portion of the conductive pad 20c1. A conductive material may be disposed on the dielectric layer 101 and the exposed surface of the conductive pad 20c1, forming conductive traces and vias electrically connected to the conductive pad 20c1.

Similar to the dielectric layer 101, a dielectric layer 111 may be provided and patterned on the carrier 21 and the passivation layer 23. A conductive material may be disposed on the dielectric layer 111 and the exposed surface of the conductive pad 20c2, forming conductive traces and vias electrically connected to the conductive pad 20c2.

Figure 5H:
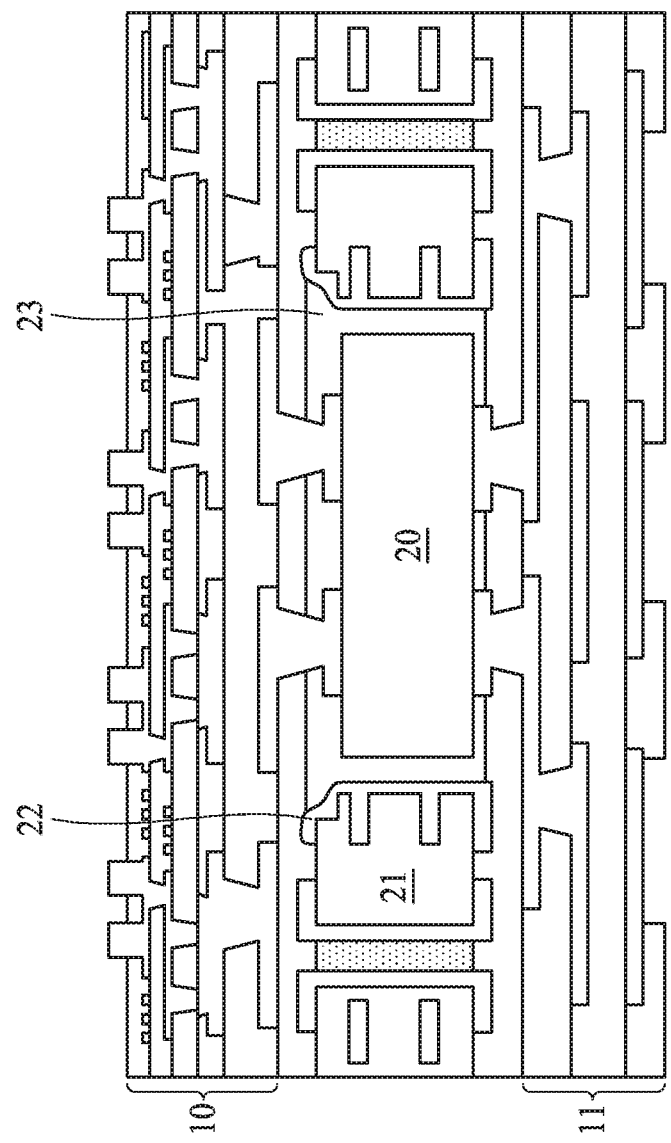
FIG. 5H illustrates one or more stages of a method of manufacturing a semiconductor device package in accordance with some embodiments of the present disclosure.

The operations described above for the formation of the dielectric layers 101 and 111 and the conductive traces and vias may be repeatedly performed two or more times to form multi-layers of dielectric layers and the conductive traces, and the resulting structure is shown in FIG. 5H.

Referring to FIG. 5H, interconnection structures 10 and 11 may be disposed on surfaces (e.g., a top surface and a bottom surface) of the carrier 21.

In some embodiments, one or more electronic components (such as the electronic components 12 and 13 as illustrated in FIG. 1) may be disposed on a surface of the interconnection layer 10 facing away from the carrier 21 by a capillary or through other tools. In some embodiments, the electronic components may be disposed on an adhesive layer, glue or other intermediate layers for die-attaching. In some embodiments, an encapsulation layer (such as the encapsulation layer 14 as illustrated in FIG. 1) may be disposed on the interconnection layer 10 to cover or encapsulate the electronic components. In some embodiments, the encapsulation layer may be formed by a molding technique, such as transfer molding or compression molding. In some embodiments, one or more electrical contacts (such as the electrical contact 15 as illustrated in FIG. 1) may be provided on a surface of the interconnection layer 11 facing away from the carrier 21. The resulting structure may be similar to the semiconductor device package 1 as illustrated in FIG. 1.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   an electronic component having a first surface, a second surface opposite the first surface, and a lateral surface extended between the first surface and the second surface;
   a first passivation layer having an inner surface surrounding the electronic component;
   a conductive layer disposed on the inner surface of the first passivation layer and having a relatively rough surface, wherein the relatively rough surface of the conductive layer has an arithmetical mean roughness (Ra) ranging from about 0.3 micrometer (μm) to about 1.0 μm.

2. The semiconductor device package of claim 1, wherein the conductive layer has a first portion extending into the first passivation layer.

3. The semiconductor device package of claim 1, wherein the inner surface of the first passivation layer has a step.

4. The semiconductor device package of claim 3, wherein the step is in direct contact with the conductive layer.

5. The semiconductor device package of claim 3, wherein the conductive layer has a slanted surface.

6. The semiconductor device package of claim 5, wherein the slanted surface is disposed over the step.

7. The semiconductor device package of claim 3, wherein the conductive layer has a curved surface.

8. The semiconductor device package of claim 1, wherein the relatively rough surface of the conductive layer has a ten-point mean roughness (Rz) ranging from about 3.0 μm to about 10.0 μm.

9. The semiconductor device package of claim 1, further comprising:
   a second passivation layer between the electronic component and the conductive layer.

10. The semiconductor device package of claim 9, wherein the second passivation layer is in direct contact with the conductive layer.

11. The semiconductor device package of claim 1, wherein the first passivation layer includes a core substrate defining a space, and the electronic component is received in the space.

12. The semiconductor device package of claim 11, further comprises:
    a second passivation layer disposed in the space defined by the core substrate.

13. A semiconductor device package, comprising:
    an electronic component having a first surface, a second surface opposite the first surface, and a lateral surface extended between the first surface and the second surface; and
    a first passivation layer having a first surface, a second surface opposite the first surface, and an inner surface surrounding the electronic component, wherein the inner surface includes a first portion and a second portion on the first portion; and
    a conductive layer disposed on the inner surface of the first passivation layer, wherein the conductive layer has an arithmetical mean roughness (Ra) ranging from about 0.3 μm to about 1.0 μm;

wherein the first portion of the inner surface of the first passivation layer has a first width and the second portion of the inner surface of the first passivation layer has a second width, and the second width is greater than the first width.

14. The semiconductor device package of claim 13, wherein the inner surface has a step.

15. The semiconductor device package of claim 14, wherein the step is in direct contact with the conductive layer.

16. The semiconductor device package of claim 15, wherein the conductive layer has a slanted surface.

17. The semiconductor device package of claim 14, wherein the step is adjacent to the first surface of the first passivation layer, and wherein the first surface of the first passivation layer and the first surface of the electronic component are at different elevations.

18. The semiconductor device package of claim 13, wherein the conductive layer has an extension into the first passivation layer.

19. The semiconductor device package of claim 13, further comprising:

a second passivation layer between the electronic component and the conductive layer.

* * * * *